United States Patent Office 3,179,518

Patented Apr. 20, 1965

3,179,518

PRESENSITIZED PRINTING FOIL HAVING AS A COATING THEREON A LIGHT-SENSITIVE DIAZO COMPOUND WITH POLYVINYL PHOSPHONIC ACID

Oskar Sus, Fritz Uhlig, and August Rebenstock, Wiesbaden-Biebrich, Germany, assignors, by mesne assignments, to Azoplate Corporation, Murray Hill, N.J.

No Drawing. Filed Mar. 1, 1963, Ser. No. 262,188
Claims priority, application Germany Mar. 3, 1962
16 Claims. (Cl. 96—33)

It is known to improve the printing qualities of a presensitized printing foil, which contains a diazo compound in its light-sensitive layer and is suitable for the photomechanical preparation of printing plates, by the inclusion in the light-sensitive layer of a compound of high molecular weight, such as a natural resin or a colloid or a synthetic resin, e.g. a phenol-formaldehyde resin, a vinyl polymer or an interpolymer of a vinyl compound and an unsaturated acid, e.g. maleic acid. These compounds of high molecular weight increase the resistance of the printing image, obtained after exposure, to attack by the developer employed and also to mechanical abrasion during printing. As a result, a considerable increase in the printing run is obtained. The increased adherence of the printing image to the support is attributed to the fact that the light-decomposition products become tanned by reaction with the compound of high molecular weight.

If the compound of high molecular weight also contains carboxyl groups, an example being polyacrylic acid, the preparation of the printing plate is also simplified inasmuch as mere wiping or rinsing of the printing image with water is sufficient to render the image-free parts water-acceptant; otherwise this must be done by subsequent acid treatment of the exposed and developed printing foil.

In the case of polyacrylic acid, however, the aforesaid advantages are obtained in the preparation of printing plates by the negative process with a restricted number of diazo compounds only. Moreover, printing foils in which the light-sensitive layer contains a diazo compound and polyacrylic acid yield only a moderate length of run and a printing image of moderate acid resistance.

The present invention provides a presensitized printing foil which contains in its light-sensitive layer a diazo compound and polyvinyl phosphonic acid. The foil may be prepared by the application of a coating solution containing a diazo compound and polyvinyl phosphonic acid, the latter in an amount in the range of about 0.05 to 1% by weight of the solution, to a supporting foil. Polyvinyl phosphonic acid is readily soluble in water and moderately soluble in organic solvents. The preparation thereof is described in German Patent No. 1,106,963.

The supporting foil is preferably of metal, e.g. aluminum, or paper. The aluminum foil is preferably roughened and this may be done mechanically or electrolytically or the surface of the foil may be altered by chemical action, e.g. provided with a "Böhmite" layer produced by treatment with hot water.

To ensure uniform coating of the support, it is generally advantageous to use a mixture of an organic solvent with water as the solvent for the diazo compound and the polyvinyl phosphonic acid. The organic solvent may be an alcohol, an ether alcohol, a ketone, an amide of formic acid or a cyclic ether and it preferably has a boiling point in the range of 100 to 150° C. Use of the organic solvent is necessary if the diazo compound is difficultly soluble in water.

The copies obtained by exposure to light of the presensitized printing foil under a transparent master can readily be developed to a finished printing image by rinsing or spraying with water containing no additional chemicals. The polyvinyl phosphonic acid contained in the printing foil has strongly acid properties and serves during development to render the foil water-acceptant in the image-free areas. The resulting printing plate has high mechanical strength and gives a large number of prints when used in a planographic printing machine. The number of prints obtainable can be considerably increased by treatment of the printing image with a lacquer dissolved in a solvent or emulsified in water.

The diazo compounds which can be used extend over a wide range. They are preferably used in the form of salts of inorganic acids, advantageously hydrohalide acids, and particularly in the form of double salts with metal salts such as zinc chloride. Diazo compounds from amino diphenylamine and substitution products thereof are very suitable, as also are diazo compounds from the carbazole series, which are closely related to the diazodiphenylamines. The diazodiphenyl series of light-sensitive compounds which are commonly used in diazotype processes also give good results, as also do other diazo compounds containing a number of carbocyclic rings, in some cases connected by heteroatoms. Diazo compounds containing sulfonamide groups, preferably those with polybasic aromatic amines, are particularly advantageous. Strongly basic groups in the molecule of the diazo compound, e.g. the dialkylamino group, sometimes reduce the adherence to the support of the printing image. It is therefore preferred, insofar as the invention contemplates the use of diazo compounds which contain a strongly basic group, that the compound should also contain a second substituent which reduces basicity, e.g. a sulfonamide group. Sometimes it is advantageous for the diazo compounds to be used in the form of anhydrides because this increases their solubility in organic solvents.

Diazo compounds of high molecular weight, e.g. those obtained by the condensation of diazodiphenylamine with formaldehyde, can also be used.

In the following examples parts by volume are in milliliters and parts by weight are in grams.

*Example 1*

1 part by weight of diphenylamine-4-diazonium chloride is solved in 92 parts by volume of glycol monomethyl ether and 0.05 part by weight of a polyvinyl phosphonic acid having a K-value (specific viscosity according to Fikentscher) of 24 to 27 are dissolved in 8 parts by weight of water. The two solutions are mixed together and the mixture is coated upon an aluminum foil which has been brushed on both sides and dried at 100° C.

The resulting foil is exposed under a negative film master, for 15 to 60 seconds at a distance of 70 cm., to an 18-amp carbon arc lamp of the type normally used in diazotype processes. It is developed by wiping over with water or an aqueous gum arabic solution. The resulting positive printing plate can be immediately set up in a printing machine and used for printing.

The following compounds can be used in the same way in the following proportions:

1 part by weight of 3-methoxy diphenylamine-4-diazonium chloride and 0.2 part by weight of polyvinyl phosphonic acid.

1 part by weight of diphenylamine-4-diazonium sulfate and 0.3 part by weight of polyvinyl phosphonic acid.

*Example 2*

0.1 part by weight of polyvinyl phosphonic acid is dissolved in 4 parts by volume of water and the solution is made up to 100 ml. with glycol monomethyl ether. 1.3 parts by weight of the chloride of the bisdiazo compound from N,N′-bis-(4-amino-diphenylamine-2-sulfonyl)-4,4′-diamino-diphenyl of formula

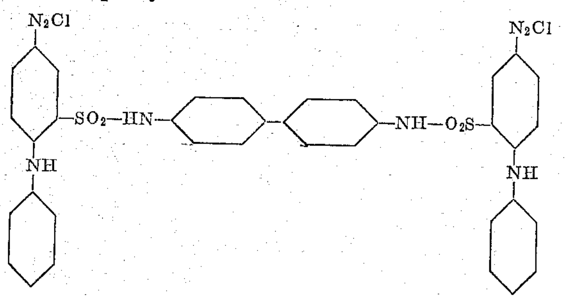

are added to the solution and dissolved therein. This solution is coated by means of a whirler upon an aluminum foil which has been mechanically roughened on both sides. After drying for a short time in a hot air current, the coated foil is further dried for two minutes at 100° C. to remove all traces of solvent.

The resulting sensitized foil is exposed under a negative film master for about two minutes to an 18-amp carbon arc lamp at a distance of 70 cm. Development is effected with water applied with the aid of a cotton swab or a spray. The printing image can be inked up with greasy ink immediately without any intermediate acid treatment. From a negative master, a positive printing plate is obtained.

Instead of the above-mentioned diazo compound, the chloride of bis-diazo-compound from 4,4′-bis-(4-amino-diphenylamine-2-sulfonylamino)-2,2′,5,5′-tetramethyl-tri-phenylmethane of formula

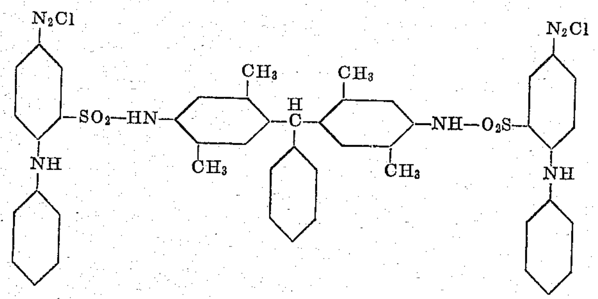

can be used with equal advantage.

The bis-diazo compound from N,N′-bis-(4-aminodiphenylamine-2-sulfonyl)-4,4′-diamino diphenyl may be prepared as follows:

56.1 parts by weight of 4-nitro-diphenylamine-2-sulfochloride are dissolved in 120 parts by volume of dioxane. A solution consisting of 18.4 parts by weight of benzidine, 15.8 parts by volume of pyridine and 80 parts by volume of dioxane are then added dropwise, with stirring, at a temperature of 60 to 70° C. The reaction mixture is maintained at this temperature for one hour. To isolate the reaction product, the solvent is evaporated and the residue is absorbed in dilute sodium hydroxide solution, filtered off, and acidified with hydrochloric acid until it gives an acid reaction to Congo red. The condensation product, N,N′-bis-(4-nitro-dihpenyl-2-sulfonyl)-4,4′-diamino-diphenyl, then separates out as a yellow precipitate. It is filtered off under suction, washed with water and dried; the yield is 70 g. This dinitro compound has a melting point of 140 to 145° C. and decomposes at 225° C. The dinitro compound is dissolved in 500 parts by volume of 1 N sodium hydroxide and catalytically reduced in contact with nickel. The resultant solution is freed from nickel by filtration and the clear solution is treated with 25 parts by volume of a 40% aqueous solution of sodium nitrite. It is then allowed to run into excess hydrochloric acid containing pieces of ice; the solution is stirred for one hour. The bis-diazo compound separates out as the bis-diazonium chloride in the form of a yellow product. It is filtered off under suction, washed with water and dried. When heated, it decomposes at about 150° C.

The bis-diazo compound from 4,4′-bis-(4-amino-diphenylamine-2-sulfonylamino)-2,2′,5,5′-tetramethyl-tri-phenyl methane may be prepared in an analogous manner. The bis-diazo compound is in the form of a yellow powder. It melts at about 175° C. with decomposition.

*Example 3*

As in the preceding example, an aluminum foil which has been mechanically superficially roughened on both sides is coated with a solution of 0.1% by weight of polyvinyl phosphonic acid and 1.5% by weight of the diazo compound of the formula

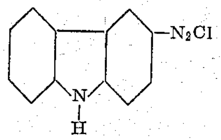

in glycolmonomethyl ether containing 4% by weight of water. It is advantageous to first dissolve the polyvinyl phosphonic acid in water, then add the glycolmonomethyl ether, and then the diazo compound.

After exposure, which is carried out as in Example 2, a strong blue image is obtained which can be developed with water to yield a printing plate which is positive when a negative master has been used.

*Example 4*

Presensitized printing foils are prepared by the procedure of Example 2 using the zinc chloride double salt of the bis-diazonium chloride from N,N′-bis-(1-dimethyl-amino-4-amino-benzene-2-sulfonyl)-p-phenylene diamine having the formula

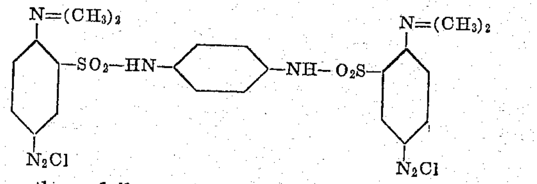

Using these foils, positive printing plates are obtained from negative masters.

The zinc chloride double salt of the bis-diazo compound from N,N′-bis-(1-dimethylamino-4-amino-benzene-2-sulfonyl)-p-phenylene diamine may be prepared as follows:

130 parts by weight of 1-chloro-4-nitro-benzene-2-sulfochloride are dissolved in 300 parts by volume of dioxane and mixed, with stirring, at a temperature of 50 to 60° C. with a solution consisting of 27 parts by weight of p-phenylene diamine, 40 parts by volume of pyridine and 350 parts by volume of dioxane. The condensation product precipitates out and is filtered off under suction. The two halogen atoms are replaced by dimethylamino groups by heating the condensation product for 2 hours in a closed vessel, at 100 to 120° C., with a 40% aqueous solution of dimethylamine. The resulting N,N′-bis-(1-dimethylamino-4-nitrobenzene-2-sulfonyl)-p-phenylene-diamine melts at 241° C.

The nitro groups are reduced by means of sodium dithionite in alkaline aqueous solution. The diamine precipitates out of the clear solution as a colorless product when acetic acid is added; it is filtered off under suction and washed with water. The diamine is diazotized by dissolving it in dilute hydrochloric acid, filtering over charcoal and treating with a 2 N sodium nitrite solution. The bis-diazo compound is precipitated in the form of the zinc chloride double salt.

*Example 5*

To obtain light-sensitive printing foils for the preparation of positive printing plates from negative masters, the procedure described in Example 2 is followed, but instead of the bis-diazo compound therein described the zinc chloride double salt of 1-benzoyl-amino-2,5-diethoxy-benzene-4-diazonium chloride or a salt of the diazo compound from 4-amino-2,5-diethoxy-4'-methyl-diphenyl sulfide is used.

*Example 6*

A solution of 0.1 part by weight of polyvinyl phosphonic acid in 8 parts by volume of water is prepared and 92 parts by volume of a mixture of 60 parts by volume of glycol monomethyl ether and 40 parts by volume of dimethyl formamide is added. 0.5 part by weight of 1 - toluyl-sulfimino-2-(2',5'-dimethylphenyl-amino-sulfonyl)-p-benzoquinone diazide of formula

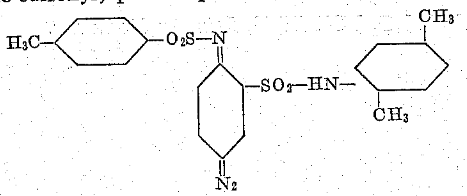

is then dissolved in this solution and the solution is coated upon a paper printing foil prepared as described in U.S. Patent No. 2,534,588.

The resulting presensitized printing foil, after imagewise exposure, is developed with water. A negative printing image, with respect to the master, is obtained from which good runs are obtainable. A striking feature is the excellent ink acceptance, in comparison with a printing image on a similar printing foil prepared without polyvinyl phosphonic acid.

*Example 7*

A presensitized printing foil is prepared in accordance with the procedure of Example 2 using the diazo compound of the formula

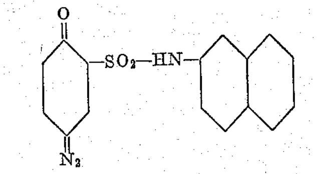

i.e. p-benzoquinone-4-diazide-2-sulfonyl-β-naphthylamide.

A positive printing plate is obtained from a negative master.

*Example 8*

A mechanically roughened aluminum foil, or an aluminum foil which has been covered with a böhmite layer or has been electrolytically roughened, is coated with a light-sensitive solution obtained by mixing together the following components:

0.5 part by weight of a crude condensate from paraformaldehyde and diphenylamine-4-diazonium chloride described in detail below, 0.1 part by weight of polyvinyl phosphonic acid, 8 parts by weight of water, 80 parts by weight of glycol monomethyl ether and 20 parts by weight of butyl acetate. The coated foil is dried for two minutes at 100° C.

The resulting presensitized printing foil is exposed under a photographic negative, e.g. for 60 seconds to a 20-amp arc lamp at a distance of 70 cm. The exposed coating is then developed with water by intensive rubbing of the entire surface of the foil. As a result, the image-free, unexposed parts of the coating are dissolved away. Those parts of the coating affected by the light are hardened and remain adhered to the foil and, after development, take up greasy ink when it is applied thereto. The plate is then ready for printing.

The developed foil may be treated with a lacquer such, for example, as that described in U.S. Patent No. 2,754,-279, in order to extend the printing run. The lacquer is wiped over until the image parts stand out in deep color.

The above-mentioned crude condensate from p-formaldehyde and diphenylamine-4-diazonium chloride may be prepared as follows:

3.3 parts by weight of paraformaldehyde and 23 parts by weight of diphenylamine-4-diazonium chloride are stirred at room temperature into 42 parts by weight of 85% phosphoric acid. A viscous solution is formed which is further stirred for half an hour at room temperature and then heated to 40° C.; this temperature is maintained for a further 24 hours. The reaction is then complete.

In this reaction, the phosphoric acid can be replaced by the same quantity of pyrophosphoric acid or metaphosphoric acid.

The condensation product, a homogeneous viscous mixture, has excellent storage qualities which permit of its being transported. It can be mixed with water and also with many organic solvents, e.g. methanol or other aliphatic alcohols, dioxane, glycol monomethyl ether and dimethyl formamide. The coating solution can thus be adapted, insofar as concerns the solvent, to the material to be coated. A combination of condensation products with water-soluble additives or with additives which are not soluble in water but are soluble in organic solvents can also be used. For many purposes, the viscous reaction product can be used directly without isolation of the diazo compounds contained therein, which is technically advantageous.

Instead of diphenylamine-4-diazonium chloride, 3-methoxydiphenylamine-4-diazonium chloride can be used for the condensation with formaldehyde in phosphoric acid with equal success and in the same manner.

*Example 9*

A paper foil suitable for the preparation of printing plates, e.g. a paper foil prepared as described in U.S. Patent No. 2,534,588, is coated with an aqueous light-sensitive solution containing 2% by weight of the zinc salt of a diazo compound, prepared from 1 mole of 4-diazodiphenylamine and 1 mole of paraformaldehyde by condensation in sulfuric acid, and 0.5% by weight of polyvinyl phosphonic acid. The coated foil is then dried. The paper foil is exposed under a negative and developed with water or a 5% aqueous solution of gum arabic. The foil is then set up in an offset machine and inked up with the inking rollers of the machine. The hardened image parts accept ink while the non-image parts repel the ink. Printing can then be performed.

It will be obvious to those skilled in the art that many modifications may be made within the scope of the present invention without departing from the spirit thereof, and the invention includes all such modifications.

What is claimed is:

1. A presensitized printing plate which comprises a base material having a coating thereon, the coating comprising a light-sensitive diazo compound and polyvinyl phosphonic acid.

2. A presensitized printing plate according to claim 1 in which the base material is aluminum.

3. A presensitized printing plate according to claim 1 in which the base material is aluminum having a roughened surface.

4. A presensitized printing plate according to claim 1 in which the base material is paper.

5. A presensitized priting plate according to claim 1 in which the diazo compound is a diphenylamine-4-diazonium halide.

6. A presensitized printing plate according to claim 1 in which the diazo compound is a diazodiphenyl.

7. A presensitized printing plate according to claim 1 in which the diazo compound contains a sulfonamide group.

8. A presensitized priting plate according to claim 1 in which the diazo compound is a condensation product of diazodiphenylamine and formaldehyde.

9. A process for making a printing plate which comprises exposing a coated base material to light under a master and developing the resulting image with an aqueous developer, the coating comprising a light-sensitive diazo compound and polyvinyl phosphonic acid.

10. A process according to claim 9 in which the base material is aluminum.

11. A process according to claim 9 in which the base material is aluminum having a roughened surface.

12. A process according to claim 9 in which the base material is paper.

13. A process according to claim 9 in which the diazo compound is a diphenylamine-4-diazonium halide.

14. A process according to claim 9 in which the diazo compound is a diazodiphenyl.

15. A process according to claim 9 in which the diazo compound contains a sulfonamide group.

16. A process according to claim 9 in which the diazo compound is a condensation product of diazodiphenylamine and formaldehyde.

References Cited by the Examiner

UNITED STATES PATENTS

| | | | |
|---|---|---|---|
| 3,061,429 | 10/62 | Neugebauer et al. | 96—33 |
| 3,062,644 | 11/62 | Neugebauer et al. | 96—33 |

FOREIGN PATENTS

| | | |
|---|---|---|
| 815,471 | 6/59 | Great Britain. |

NORMAN G. TORCHIN, *Primary Examiner.*